(12) United States Patent
Yamanaka et al.

(10) Patent No.: US 10,020,767 B2
(45) Date of Patent: Jul. 10, 2018

(54) LINEAR MOTOR DEVICE AND CONTROL METHOD

(75) Inventors: Shuhei Yamanaka, Tokyo (JP); Yuki Nomura, Tokyo (JP)

(73) Assignee: THK CO., LTD., Tokyo (JP)

( * ) Notice: Subject to any disclaimer, the term of this patent is extended or adjusted under 35 U.S.C. 154(b) by 0 days.

(21) Appl. No.: 14/342,726

(22) PCT Filed: Sep. 6, 2012

(86) PCT No.: PCT/JP2012/072764
§ 371 (c)(1),
(2), (4) Date: Mar. 4, 2014

(87) PCT Pub. No.: WO2013/035793
PCT Pub. Date: Mar. 14, 2013

(65) Prior Publication Data
US 2014/0210396 A1    Jul. 31, 2014

(30) Foreign Application Priority Data
Sep. 7, 2011    (JP) .................................. 2011-194729

(51) Int. Cl.
*B23Q 17/00*    (2006.01)
*H02K 7/06*    (2006.01)
(Continued)

(52) U.S. Cl.
CPC .......... *H02P 25/06* (2013.01); *H05K 13/0404* (2013.01); *H02K 41/031* (2013.01); *H02P 2205/07* (2013.01)

(58) Field of Classification Search
CPC ............................... B23Q 17/005; H02K 7/06
(Continued)

(56) References Cited

U.S. PATENT DOCUMENTS 4,786,994 A * 11/1988 Carteau ................ G11B 5/5547
318/561
6,973,714 B2 * 12/2005 Isogai ................... B23Q 17/005
269/71
(Continued)

FOREIGN PATENT DOCUMENTS

CN         101562127 A    10/2009
EP           1395105 A2     3/2004
(Continued)

OTHER PUBLICATIONS

International Search Report, dated Dec. 11, 2012, issued in corresponding application No. PCT/JP2012/072764.
(Continued)

*Primary Examiner* — Kawing Chan
*Assistant Examiner* — Cortez Cook
(74) *Attorney, Agent, or Firm* — Westerman, Hattori, Daniels & Adrian, LLP

(57) ABSTRACT

A linear motor device includes a linear motor and a controller that applies pressure to a pressurizing target by moving a needle provided with the linear motor. The controller includes: a speed-change position-setting unit that calculates a deceleration start position, which is a position where a movement speed of the needle starts to be reduced from a first speed to a second speed when the pressurizing target start to be pressurized, based on a distance required to reduce the movement speed of the needle from the first speed to the second speed which is lower than the first speed and at which pressure applied to the pressurizing target when the needle comes into contact with the pressurizing target is equal to or lower than a predetermined pressure; and a position determination unit that drives the needle of the linear motor at the first speed and at the second speed.

7 Claims, 17 Drawing Sheets

(51) Int. Cl.
*H02P 25/06* (2016.01)
*H05K 13/04* (2006.01)
*H02K 41/03* (2006.01)

(58) Field of Classification Search
USPC ..... 29/739, 740, 834; 414/752.1; 310/12.02; 318/400.2, 561, 701
See application file for complete search history.

(56) References Cited

U.S. PATENT DOCUMENTS

| | | | | |
|---|---|---|---|---|
| 2003/0014860 | A1* | 1/2003 | Isogai | B23Q 17/005 29/739 |
| 2006/0221518 | A1* | 10/2006 | Evans | H02K 7/06 361/23 |
| 2008/0309260 | A1* | 12/2008 | Kanai | H02P 25/06 318/38 |

FOREIGN PATENT DOCUMENTS

| | | |
|---|---|---|
| JP | 06-296094 A | 10/1994 |
| JP | H07-132383 A | 5/1995 |
| JP | 2000-317566 A | 11/2000 |
| JP | 2001-345599 A | 12/2001 |
| JP | 2003-025266 A | 1/2003 |
| JP | 2004-088024 A | 3/2004 |
| JP | 2006-147640 A | 6/2006 |
| JP | 2009-171683 A | 7/2009 |
| JP | 2010-232704 A | 10/2010 |
| WO | 2011/001555 A1 | 1/2011 |

OTHER PUBLICATIONS

"Vertical-Type MR Sensor Technical Data", Kohden Co., Ltd, Japan, Oct. 1, 2005, retrieval on Jul. 20, 2010, <URL: http://www.hkd.co.jp/technique/img/amr-note1.pdf>.

Notice of Allowance dated Aug. 30, 2016, issued in counterpart Japanese Patent Application No. 2013-532642, with English translation. (6 pages).

Office Action dated Feb. 16, 2016, issued in counterpart Japanese Patent Application No. 2013-532642, with English translation. (6 pages).

Office Action dated Jun. 23, 2015, issued in counterpart Japanese Application No. 2013-532642, with English translation (4 pages).

Extended European Search Report dated Jul. 15, 2015, issued in counterpart European Patent Application No. 12829734.8 (9 pages).

* cited by examiner

LINEAR MOTOR DEVICE AND CONTROL METHOD

TECHNICAL FIELD

The present invention relates to a linear motor device and a control method.

Priority is claimed on Japanese Patent Application No. 2011-194729, filed Sep. 7, 2011, the content of which is incorporated herein by reference.

BACKGROUND ART

When electronic parts or the like are mounted on a printed circuit board, a part mounting device (pick-and-place unit) that picks up an electronic part or the like from a predetermined position and disposes the electronic part or the like at a mounting position on a printed circuit board is used (PTL 1).

FIG. 25 is a view showing the structure of a part mounting device 9. As shown in FIG. 25, the part mounting device 9 includes a servo motor 91, a ball screw 92A that is mounted on a rotating shaft of the servo motor 91, an arm 93 that is fixed to a ball screw nut 92B, a linear guide 94 that guides the linear motion of the arm 93, a cushioning mechanism 95 that is mounted on one end of the arm 93, and a suction pad 96 that is mounted on the arm 93 with the cushioning mechanism 95 interposed therebetween.

The arm 93 is moved up and down by the control of the servo motor 91, so that the part mounting device 9 presses an electronic part or the like against the suction pad 96 to pick up the electronic part or the like and disposes the electronic part at a mounting position on a printed circuit board.

To reduce time that is required for a step of mounting an electronic part on a printed circuit board, the part mounting device 9 moves the arm 93 at a high speed until immediately before the suction pad 96 comes into contact with the electronic part, and picks up the electronic part by pressing the suction pad 96 with a force that does not break the electronic part after reducing the speed of the arm 93 immediately before the suction pad 96 comes into contact with the electronic part (PICK). Further, when disposing an electronic part on a printed circuit board, the part mounting device 9 moves the arm 93 at a high speed until immediately before the electronic part comes into contact with the printed circuit board, and mounts the electronic part on the printed circuit board by pressing the electronic part against the printed circuit board with a force that does not break the electronic part after reducing the speed of the arm 93 immediately before the electronic part comes into contact with the printed circuit board (PLACE). In this way, the part mounting device 9 reduces the time required for a step of mounting an electronic part by moving the arm as quickly as possible.

CITATION LIST

Patent Literature

[PTL 1] Japanese Unexamined Patent Application, First Publication No. 2004-088024

SUMMARY OF INVENTION

Problem to be Solved by the Invention

It is preferable that a position where the movement speed of the arm 93 is changed in the part mounting device 9 operating as described above be present in front of a portion where the suction pad 96 comes into contact with the electronic part or a portion where the electronic part comes into contact with the printed circuit board. However, since it is necessary to set a position (change position) where a user changes speed according to the height of the electronic part, the optimum position may not be set. For this reason, time required for a step of mounting the electronic part may be wasted. That is, wasted time may be caused to pick up the electronic part until the electronic part as a pressurizing target starts to be pressurized.

The invention has been made to solve the above-mentioned problem, and an object of the invention is to provide a linear motor device and a control method that can reduce the time required until a pressurizing target starts to be pressurized.

Means for Solving the Problem

The invention provides a linear motor device including a linear motor and a controller that applies pressure to a pressurizing target by moving a needle provided in the linear motor. The controller includes: a speed-change position-setting unit that calculates a deceleration start position, which is a position where a movement speed of the needle starts to be reduced from a first speed to a second speed, based on a distance required to reduce the movement speed of the needle from the first speed to the second speed which is lower than the first speed and at which pressure applied to the pressurizing target when the needle comes into contact with the pressurizing target is equal to or lower than a predetermined pressure and a position where the pressurizing target starts to be pressurized; and a position determination unit that drives the needle of the linear motor at the first speed when the needle is moved from a predetermined position toward the pressurizing target, and moves the needle at the second speed when the needle reaches the deceleration start position.

Further, the invention provides a control method for a linear motor device that includes a linear motor and a controller that applies pressure to a pressurizing target by moving a needle provided in the linear motor. The control method includes: a speed-change position-setting step of calculating a deceleration start position, which is a position where a movement speed of the needle starts to be reduced from a first speed to a second speed, based on a distance required to reduce the movement speed of the needle from the first speed to the second speed which is lower than the first speed and at which pressure applied to the pressurizing target when the needle comes into contact with the pressurizing target is equal to or lower than a predetermined pressure and a position where the pressurizing target starts to be pressurized; and a position determining step of driving the needle of the linear motor at the first speed when the needle is moved from a predetermined position toward the pressurizing target, and moving the needle at the second speed when the needle reaches the deceleration start position.

Effects of the Invention

According to the invention, a deceleration start position is calculated based on a position where a pressurizing target starts to be pressurized and a distance that is required to reduce the speed from a first speed to a second speed, and a linear motor is driven using the calculated deceleration start position. Accordingly, since it is possible to determine a deceleration start position according to the deceleration characteristics of the provided linear motor as compared to a case in which a user determines a position where a speed is changed to a second speed from a first speed based on experience or the like, it is possible to reduce time the linear motor is driven at the second speed. Therefore, it is possible to reduce the time that is required until a pressurizing target starts to be pressurized.

BRIEF DESCRIPTION OF DRAWINGS

In FIG. 22, the vertical axis represents the position of a suction pad 11.

DESCRIPTION OF EMBODIMENTS

A linear motor device and a control method according to an embodiment of the invention will be described below with reference to the drawings.

Figure 1:
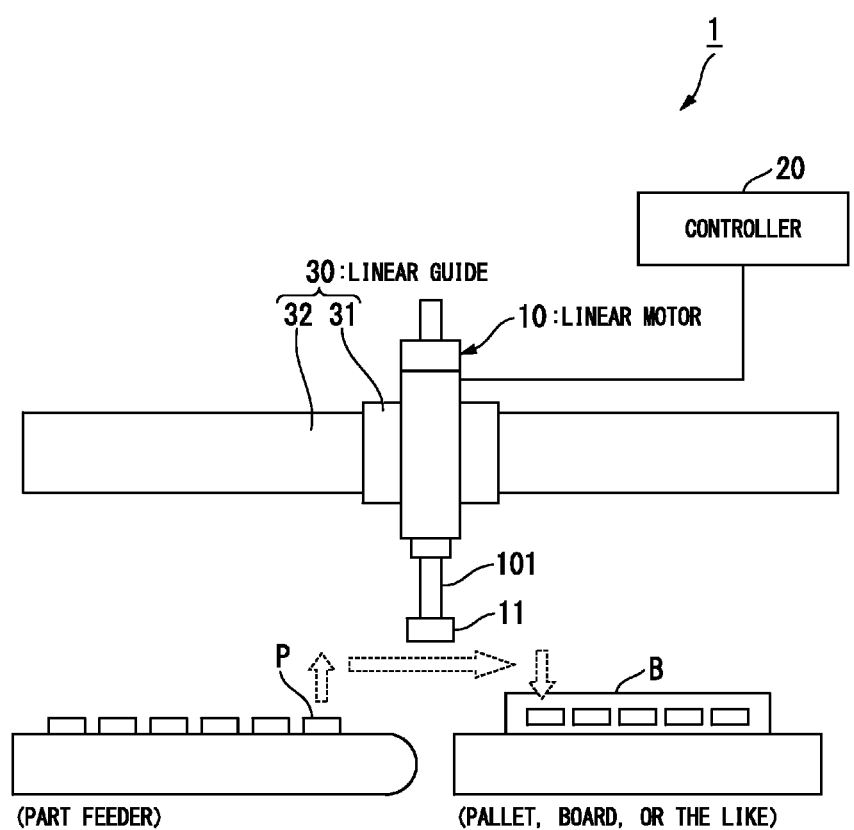
FIG. 1 is a schematic block diagram showing the structure of a part mounting device 1 of an embodiment.

FIG. 1 is a schematic block diagram showing the structure of a part mounting device 1 of the embodiment. As shown in FIG. 1, the part mounting device 1, which is a linear motor device, includes a rod type linear motor 10, a linear guide 30 on which the linear motor 10 is mounted, and a controller 20 that controls the linear motor 10.

The linear guide (linear motion guide device) 30 includes a slide block 31 and a track rail 32. The slide block 31 is assembled so as to be capable of moving along the track rail 32. The linear motor 10 is mounted on the slide block 31, so that the linear motor 10 is movable in a horizontal direction together with the slide block 31. The position of the slide block 31 can be controlled by a drive unit (not shown). That is, the linear guide 30 guides the linear motor 10 to the right and the left.

The linear motor 10 includes a rod 101 as a needle that can move up and down, and a suction pad 11 is mounted on one end of the rod 101.

The part mounting device 1 moves the linear motor 10 to a position immediately above a part feeder that aligns workpieces P such as electronic parts and feeds the workpieces one by one, and the controller 20 drives the rod 101 toward the workpieces P by controlling the linear motor 10. At this time, the controller 20 presses the suction pad 11 against the workpiece P by lowering the rod 101, and makes the suction pad 11 suck the workpiece P. The controller 20 picks up the workpiece P from the part feeder by raising the rod 101 after making the suction pad 11 suck the workpiece P, and holds the workpiece P.

After the linear motor 10 is guided by the linear guide 30 and is moved to a position immediately above a printed circuit board B on which the workpiece P is to be mounted, the controller 20 presses the workpiece P against the printed circuit board B by lowering the rod 101 to mount the workpiece P on the printed circuit board B. After that, the controller 20 raises the rod 101.

The part mounting device 1 mounts electronic parts (workpieces P), which are fed from a part feeder or the like, on the printed circuit board B by performing the above-mentioned operation.

The structure of the linear motor 10 and the controller 20 will be described below.

Figure 2:
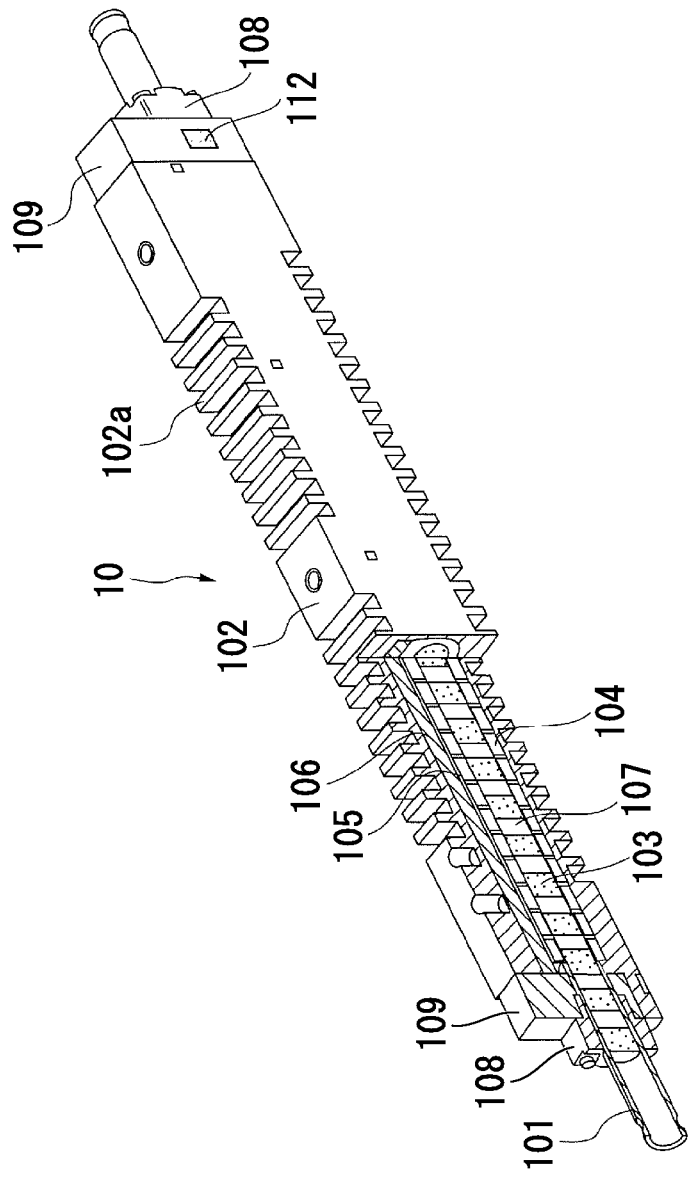
FIG. 2 is a perspective view (partial cross-sectional view) of a linear motor 10 of the embodiment.

FIG. 2 is a perspective view (partial cross-sectional view) of the linear motor 10 of the embodiment. The linear motor 10 is a rod type linear motor of which the rod 101 is moved relative to a coil housing case 102 in an axial direction.

A plurality of coils 104, which is held by a coil holder 105, is laminated (arranged) in the coil housing case 102. End cases 109 are respectively mounted on both end faces of the coil housing case 102. Bushes 108, which are bearings for guiding the linear motion of the rod 101, are mounted on the end cases 109.

Either one of the two end cases 109 is provided with a magnetic sensor 112 that detects a magnetic field generated by the rod 101.

The rod 101 is made of a non-magnetic material such as stainless steel and includes a hollow space such as a pipe. A plurality of columnar magnets 103 (segment magnets) are laminated in the hollow space of the rod 101 so that the same poles of the magnets face each other. That is, the magnets are laminated so that N poles face each other and S poles face each other. Pole shoes 107 (magnetic pole blocks), which are made of a magnetic material such as iron, are respectively interposed between the magnets 103. The rod 101 passes through the laminated coils 104, and is supported by the coil housing case 102 so as to be capable of moving in an axial direction.

Figure 3:
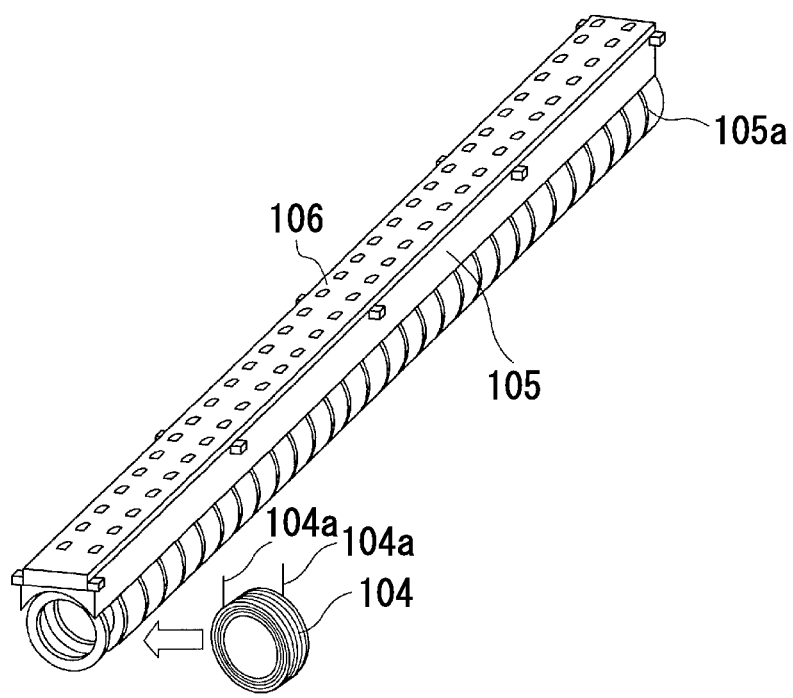
FIG. 3 is a perspective view of a coil unit that is held by a coil holder 105 of the embodiment.

FIG. 3 is a perspective view showing a coil unit that is held by the coil holder 105 of the embodiment. As shown in FIG. 3, the coils 104 are formed of spirally wound copper wires and are held by the coil holder 105. That is, the plurality of coils 104 are formed of copper wires that are wound along the outer periphery of the rod 101 around a direction in which the magnets 103 of the rod 101 are arranged, and the respective coils 104 are arranged in the same direction as the direction in which the magnets 103 are arranged.

Since the adjacent coils 104 are insulated from each other, ring-shaped spacers 105a made of a resin are respectively interposed between the coils 104. A printed circuit board 106 is provided on the coil holder 105. Wound end portions 104a of the coils 104 are connected to the printed circuit board 106, so that electric power is supplied to the wound end portions 104a through the printed circuit board 106.

In the embodiment, the coil housing case 102 is molded integrally with the coils 104 by insert molding in which the coils 104 and the coil holder 105 are set in a mold and a melted resin or a special ceramic is injected into the mold. As shown in FIG. 2, a plurality of fins 102a are formed on the coil housing case 102 to improve the heat dissipation of the coils 104. The coils 104 held by the coil holder 105 may be housed in the coil housing case 102 made of aluminum, and gaps formed between the coils 104 and the coil housing case 102 may be filled with an adhesive to fix the coils 104 and the coil holder 105 to the coil housing case 102.

Figure 4:
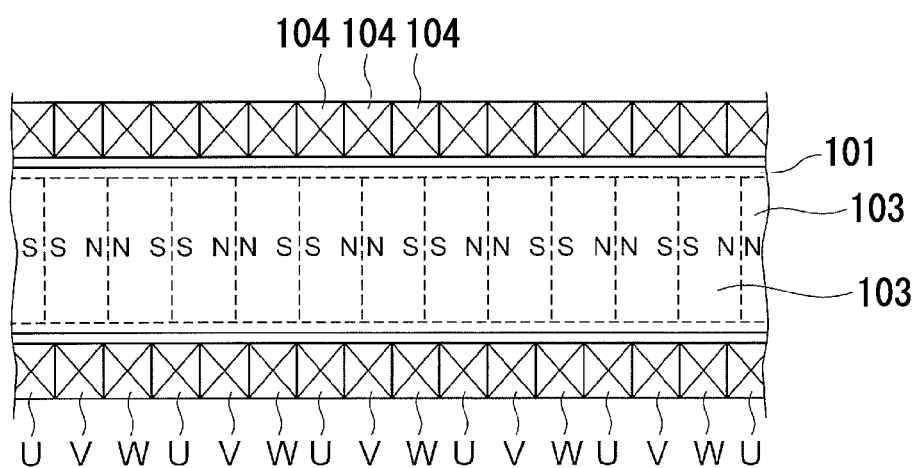
FIG. 4 is a view showing a positional relationship between magnets 103 and coils 104 of the linear motor 10 of the embodiment.

FIG. 4 is a view showing a positional relationship between the magnets 103 and the coils 104 of the linear motor 10 of the embodiment. A plurality of disc-like magnets 103 (segment magnets) are arranged in the hollow space formed in the rod 101 so that the same poles of the magnets face each other. The number of the coils 104 is three, and the coils 104 are formed of a set of three-phase coils that correspond to a U phase, a V phase, and a W phase. The coil unit is formed by the combination of a plurality of sets of three-phase coils. When three-phase currents having phases different from each other by 120° flow in the plurality of coils 104, which are divided into three phases, that is, a U phase, a V phase, and a W phase, a shifting magnetic field shifted in the axial direction of the coils 104 is generated. The rod 101 obtains thrust by a shifting magnetic field, and is linearly moved relative to the coils 104 in synchronization with the speed of the shifting magnetic field.

As shown in FIG. 2, the magnetic sensor 112 that detects the position of the rod 101 is mounted on one of the end cases 109 that is a magnetic sensor housing case. The magnetic sensor 112 is disposed so as to have a prescribed gap from the rod 101, and detects the change of the direction of a magnetic field of the rod 101 (the direction of a magnetic vector) that is generated by the linear motion of the rod 101.

Figure 5:
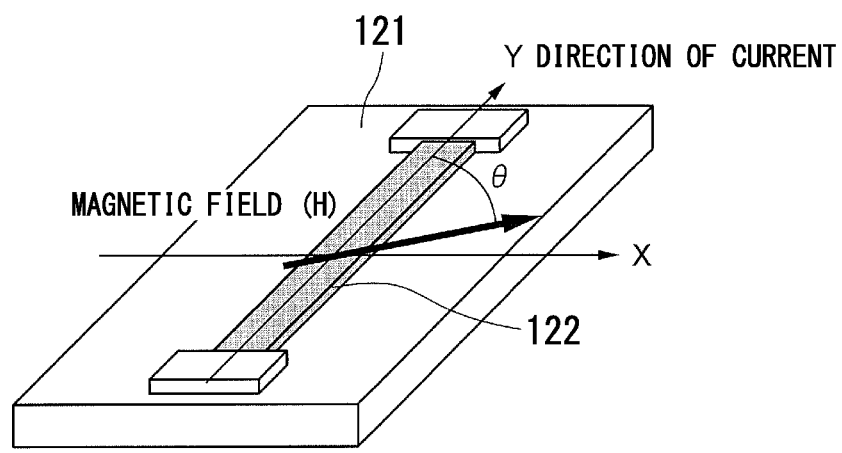
FIG. 5 is a perspective view showing a principle of a magnetic sensor.

As shown in FIG. 5, the magnetic sensor 112 includes a Si or glass substrate 121 and a magnetoresistive element 122 that is formed on the substrate and is made of ferromagnetic thin film metal, that is, an alloy containing ferromagnetic metal, such as Ni or Fe, as a main component. Since a resistance value of the magnetic sensor 112 is changed in a specific direction of a magnetic field, the magnetic sensor 112 is called an AMR (Anisotropic-Magnetro-Resistance) sensor (anisotropic magnetoresistive element) (reference literature: "vertical type MR sensor technical data", "online", Oct. 1, 2005, KOHDEN Co., Ltd "search Jul. 20, 2011", Internet <URL; http://www.hkd.co.jp/technique/img/amr-note1.pdf>).

Figure 6:
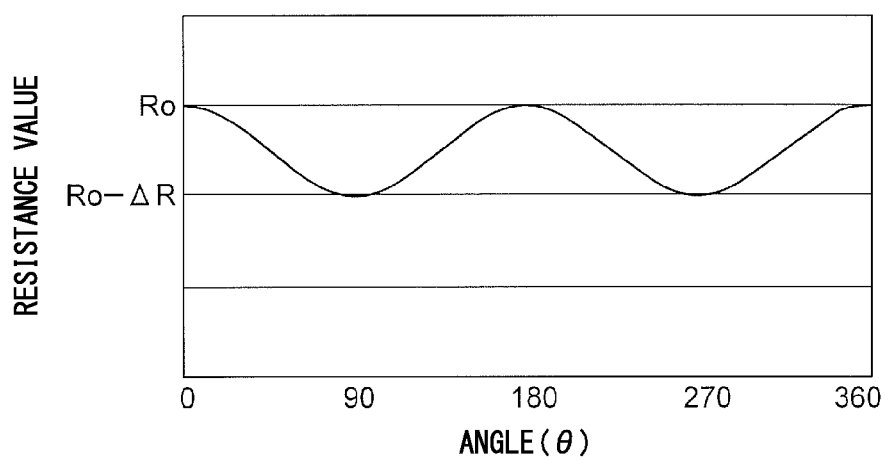
FIG. 6 is a graph showing a relationship between a direction of a magnetic field and a resistance value of an AMR sensor.

FIG. 6 is a graph showing a relationship between a direction of the magnetic field and the resistance value of an AMR sensor.

A current flows in the magnetoresistive element 122, the intensity of a magnetic field at which a resistance variation is saturated is applied to the magnetoresistive element 122, and the direction of the magnetic field (H) is changed with respect to a direction Y of a current by an angle θ. At this time, as shown in FIG. 6, a resistance variation (ΔR) is maximized when the direction of a current and the direction of a magnetic field are perpendicular to each other (θ=90°, 270°), and the resistance variation (ΔR) is minimized when the direction of a current and the direction of a magnetic field are parallel to each other (θ=0°, 180°). A resistance value R is changed so as to satisfy the following equation (1) according to angular components corresponding to the direction of a current and the direction of a magnetic field.

When the intensity of a magnetic field is equal to or higher than saturation sensitivity, ΔR becomes a constant. Accordingly, the resistance value R does not affect the intensity of a magnetic field.

$$R = R0 - \Delta R \sin 2\theta \quad (1)$$

Figure 7:
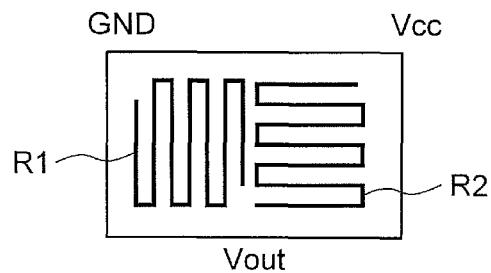
FIG. 7 is a view showing an example of the shape of ferromagnetic thin film metal of the magnetic sensor 112 detecting the direction of a magnetic field even when the intensity of a magnetic field is equal to or higher than saturation sensitivity.

R0: a resistance value of ferromagnetic thin film metal when there is no magnetic field
ΔR: resistance variation
θ: angle indicating the direction of a magnetic field FIG. 7 is a view showing an example of the shape of ferromagnetic thin film metal of the magnetic sensor 112 detecting the direction of a magnetic field even when the intensity of a magnetic field is equal to or higher than saturation sensitivity. As shown in FIG. 7, a shape in which a ferromagnetic thin film metal element (R1) formed in a vertical direction and an element (R2) formed in a horizontal direction are connected to each other in series is formed.

A vertical magnetic field, which causes the largest change of the resistance of the element (R1), causes the smallest change of the resistance of the element (R2). Resistance values R1 and R2 are obtained from the following equations (2) and (3).

$$R1 = R0 - \Delta R \sin 2\theta \quad (2)$$

$$R2 = R0 - \Delta R \cos 2\theta \quad (3)$$

Figure 8:
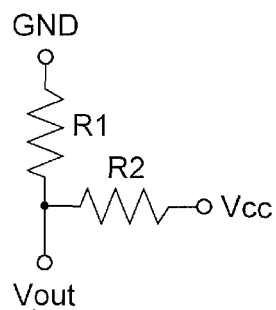
FIG. 8 is a view showing an equivalent circuit (half bridge) of the magnetic sensor.

FIG. 8 is a view showing an equivalent circuit (half bridge) of the magnetic sensor. An output Vout of this equivalent circuit is obtained from the following equation (4).

$$V\text{out} = R1 \cdot Vcc/(R1 + R2) \quad (4)$$

When Equations (2) and (3) are substituted into Equation (4) and Equation (4) is arranged, the following equations (5-1) and (5-2) are obtained.

$$Vout = Vcc/2 + \alpha \cos 2\theta \quad (5\text{-}1)$$

$$\alpha = \Delta R \cdot Vcc/2(2R0 - \Delta R) \quad (5\text{-}2)$$

Figure 9:
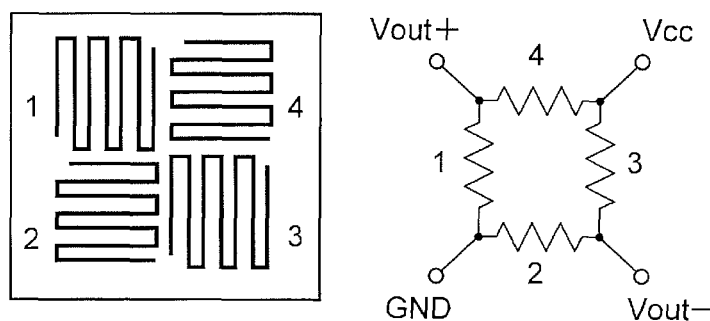
FIG. 9 is a view showing an example of the shape of ferromagnetic thin film metal of the magnetic sensor detecting the direction of a magnetic field.

FIG. 9 is a view showing an example of the shape of ferromagnetic thin film metal of the magnetic sensor detecting the direction of a magnetic field. When the shape of ferromagnetic thin film metal is formed as shown in FIG. 9, it is possible to improve and increase the stability of a midpoint potential by using two outputs Vout+ and Vout−.

The change of the direction of a magnetic field and an output of the magnetic sensor 112, when the rod 101 is linearly moved, will be described.

Figure 10:
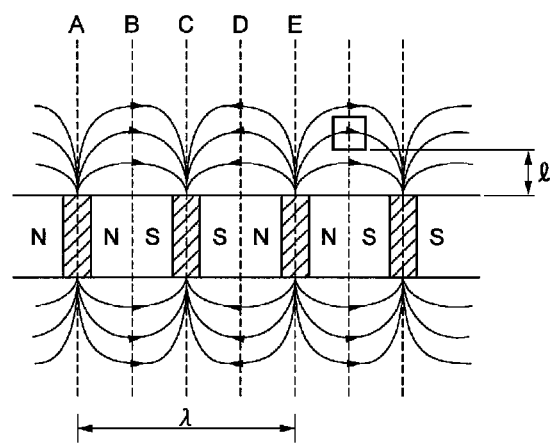
FIG. 10 is a view showing a positional relationship between a magnetic sensor 112 and a rod 101.

FIG. 10 is a view showing a positional relationship between the magnetic sensor 112 and the rod 101. As shown in FIG. 10, the magnetic sensor 112 is disposed at a position of a gap 1 to which the intensity of a magnetic field equal to or higher than saturation sensitivity is applied so that the change of the direction of a magnetic field contributes to the surface of the sensor.

In this case, when the magnetic sensor 112 is relatively moved along the rod 101 by a distance λ of positions A to E, the output of the magnetic sensor 112 is as follows.

Figure 11:
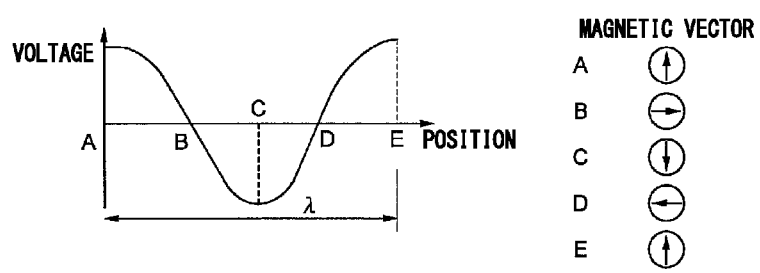
FIG. 11 is a view showing an example of a signal that is output from the magnetic sensor 112.

FIG. 11 is a view showing an example of a signal that is output from the magnetic sensor 112. As shown in FIG. 11, the direction of a magnetic field makes one rotation on the surface of the sensor when the rod 101 is linearly moved by the distance λ. A signal of a voltage at this time is a sine wave signal corresponding to one period. More precisely, a voltage Vout indicated by Equation (5-1) is a sine wave signal corresponding to two periods. However, if a bias magnetic field is applied at 45° with respect to the extending direction of an element of the magnetic sensor 112, a period is reduced by half and an output waveform corresponding to one period is obtained when the rod 101 is linearly moved by the distance λ.

Figure 12:
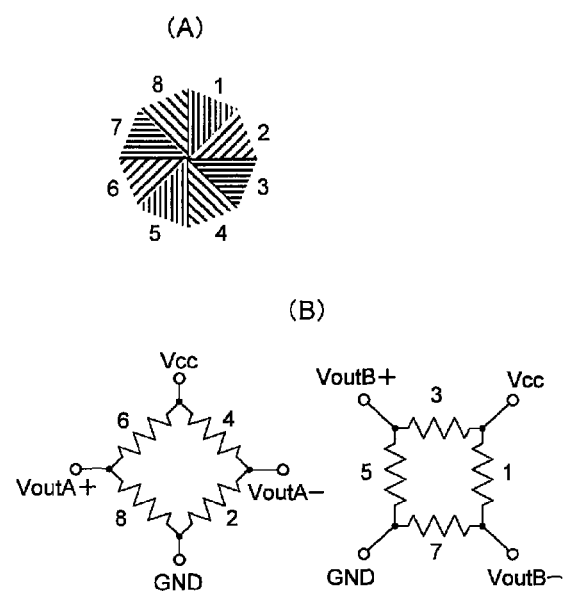
FIG. 12 is a view showing a magnetic sensor that uses two sets of full bridge structures.
Figure 13:
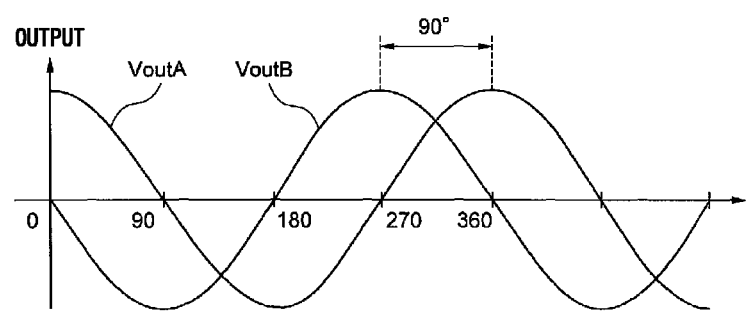
FIG. 13 is a graph showing signals that are output from the magnetic sensor of FIG. 12.

Two sets of elements having full bridge structures may be formed on one substrate so as to be inclined to each other at 45° as shown in FIG. 12 to detect the direction of motion. Outputs VoutA and VoutB, which are obtained by two sets of full bridge circuits, are a cosine wave signal and a sine wave signal having a phase difference of 90° therebetween as shown in FIG. 13.

Figure 14:
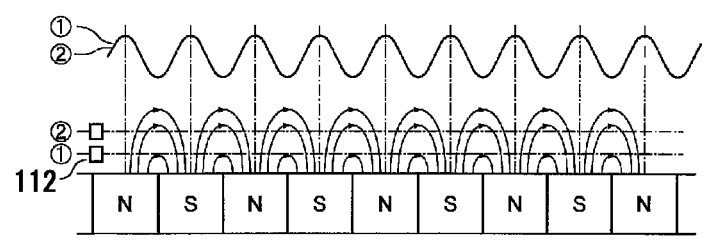
FIG. 14 is a conceptual diagram showing a positional relationship between the rod 101 and the magnetic sensor 112 and a signal that is output from the magnetic sensor 112.

In the embodiment, the magnetic sensor 112, in which two sets of elements having full bridge structures are formed on one substrate so as to be inclined to each other at 45° as shown in FIG. 12, detects the change of the direction of the magnetic field of the rod 101. Accordingly, even though the mounting position of the magnetic sensor 112 is shifted to (2) from (1) as shown in FIG. 14, changes of the sine wave signal and the cosine wave signal (the outputs VoutA and VoutB) output from the magnetic sensor 112 are little.

Figure 15:
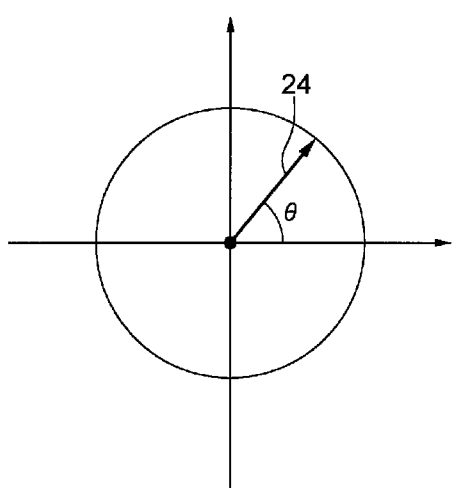
FIG. 15 is a view showing a Lissajous figure that is drawn by outputs VoutA and VoutB of the magnetic sensor 112.

FIG. 15 is a view showing a Lissajous figure that is drawn by the outputs VoutA and VoutB of the magnetic sensor 112. Since the changes of the outputs of the magnetic sensor 112 are little, the size of a circle shown in FIG. 15 is hardly changed. For this reason, it is possible to accurately detect a direction θ of the magnetic vector 24. Since it is possible to detect the accurate position of the rod 101 even though the gap 1 between the rod 101 and the magnetic sensor 112 is not managed with high accuracy, it is easy to adjust the mounting of the magnetic sensor 112. In addition, it is possible to make the rod 101, which is guided by the bushes 108, have backlash and to allow the rod 101 to be bent.

Figure 16:
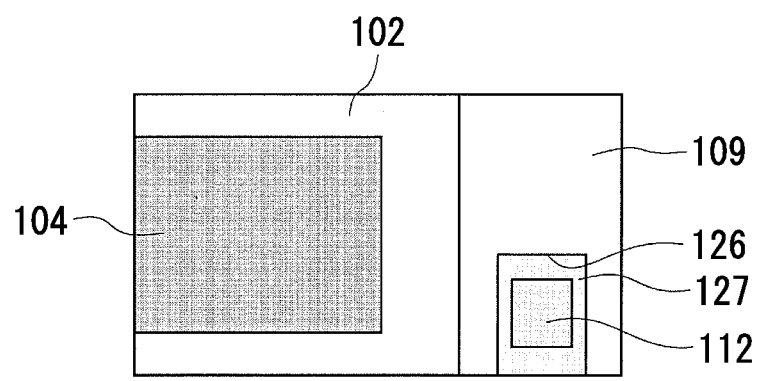
FIG. 16 is a view showing the magnetic sensor 112 that is mounted on an end case 109.

FIG. 16 is a view showing the magnetic sensor 112 that is mounted on the end case 109. The end case 109 is provided with a magnetic sensor housing portion 126 that is configured of a space to house the magnetic sensor 112.

After the magnetic sensor 112 is disposed in the magnetic sensor housing portion 126, the peripheral portion of the magnetic sensor 112 is buried in a filler 127. Accordingly, the magnetic sensor 112 is fixed to the end case 109. The magnetic sensor 112 has temperature characteristics and the output of the magnetic sensor 112 is changed according to the change of temperature. For the reduction of an influence of heat received from the coils 104, a material of which thermal conductivity is lower than the thermal conductivity of the coil housing case 102 is used for the end case 109 and the filler 127. For example, an epoxy resin is used for the coil housing case 102 and a polyphenylene sulfide (PPS) is used for the end case 109 and the filler 127.

Figure 17:
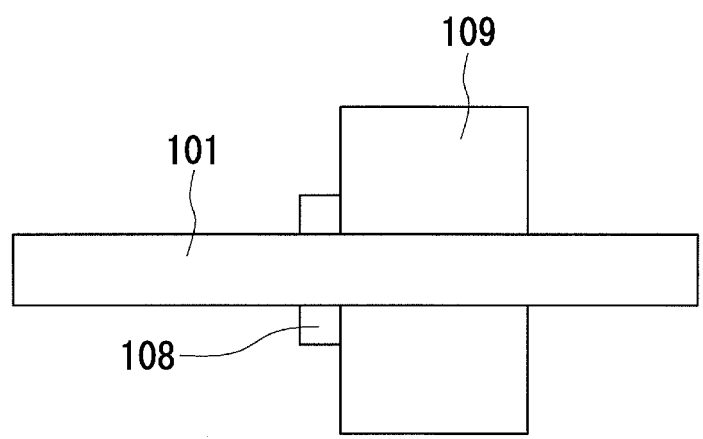
FIG. 17 is a view showing a bush 108 that is a bearing mounted on the end case 109.

FIG. 17 is a view showing the bush 108 that is a bearing mounted on the end case 109. It is possible to prevent the change of a gap, which is formed between the rod 101 and the magnetic sensor 112, by making the end case 109 to have a bearing function.

Figure 18:
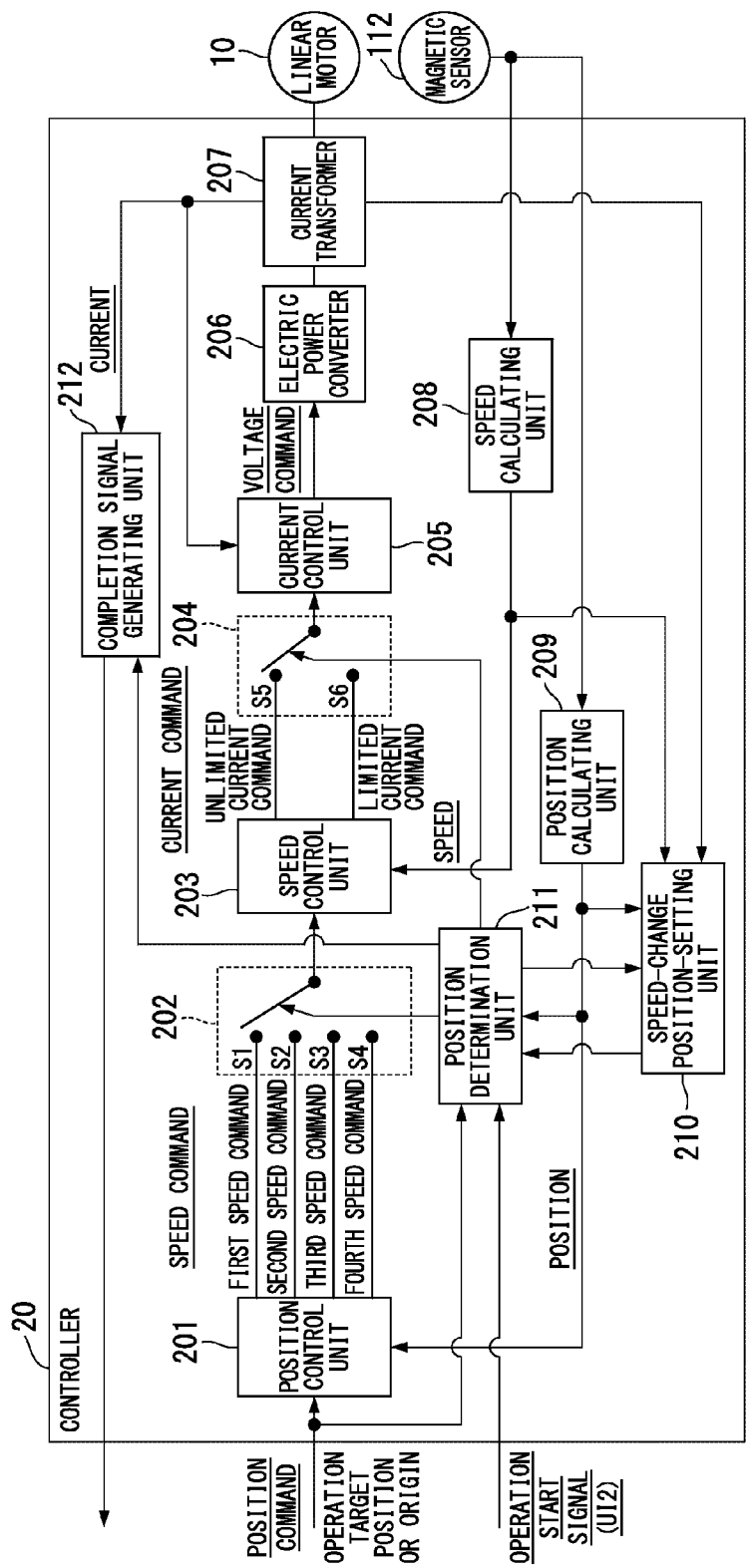
FIG. 18 is a schematic block diagram showing the structure of a controller 20 of the embodiment.

FIG. 18 is a schematic block diagram showing the structure of the controller 20 of the embodiment. As shown in FIG. 18, the controller 20 includes a position control unit 201, a switch unit 202, a speed control unit 203, a switch unit 204, a current control unit 205, an electric power converter 206, a current transformer (CT) 207, a speed calculating unit 208, a position calculating unit 209, a speed-change position-setting unit 210, a position determination unit 211, and a completion signal generating unit 212.

The position control unit 201 calculates a speed command based on a position command that is input from the outside and information that indicates the position of the rod 101 of the linear motor 10 calculated by the position calculating unit 209. Further, the position control unit 201 stores first to fourth speeds (FL1SPD to FL4SPD) in advance, and outputs four speed commands (first to fourth speed commands) based on the first to fourth speeds.

The first speed command is a command that indicates the movement speed of the rod 101 when the rod 101 moves the suction pad 11 mounted on one end of the rod 101 to the vicinity of the workpiece P (FL (Force Limit) mode start position) from a predetermined origin. The upper limit of the movement speed of the rod 101 at the first speed command is set in advance as the first speed (FL1SPD). For example, the maximum speed, which is obtained when the linear motor 10 moves the rod 101, is referred to as the first speed (FL1SPD).

The second speed command is a command that indicates the movement speed of the rod 101 when the rod 101 moves the suction pad 11 from the vicinity of the workpiece P until the suction pad 11 is coming into contact with the workpiece P. The movement speed of the rod 101 at the second speed command is set in advance as the second speed (FL2SPD). The second speed (FL2SPD) is a speed lower than the first speed (FL1SPD), and is set to be equal to or lower than a speed that does not generate unnecessary impact when the suction pad 11 comes into contact with the workpiece P. In other words, a speed, at which pressure applied to the workpiece P when the suction pad 11 comes into contact with the workpiece P is equal to or lower than pressure not generating the deformation or damage of the workpiece P, is referred to as the second speed (FL2SPD).

The third speed command is a command that indicates the speed of the rod 101 when the rod 101 is moved toward the origin after the workpiece P is sucked to the suction pad 11 and after the workpiece P is mounted on the printed circuit board B. The movement speed of the rod 101 at the third speed command is set in advance as the third speed (FL3PSD).

The fourth speed command is a command that indicates the speed of the rod 101 when the rod 101 is moved toward the origin after the workpiece P is sucked to the suction pad 11 and after the workpiece P is mounted on the printed circuit board B. The upper limit of the movement speed of the rod 101 at the fourth speed command is set in advance as the fourth speed (FL4SPD). A speed, which is higher than the third speed (FL3SPD), is set as the fourth speed (FL4SPD). For example, similar to the first speed (FL1SPD) the maximum speed, which is obtained when the linear motor 10 moves the rod 101, is referred to as the fourth speed (FL4SPD).

The switch unit 202 selects any one of the four speed commands, which are output from the position control unit 201, based on the control of the position determination unit 211.

The speed command that is selected by the switch unit 202 and speed information that indicates the speed of the rod 101 of the linear motor 10 calculated by the speed calculating unit 208 are input to the speed control unit 203. The speed control unit 203 calculates a current value, which is used to set the movement speed of the rod 101 to a speed indicated by the speed command, based on a deviation between the speed that is indicated by the speed command and the speed that is indicated by the speed information.

The speed control unit 203 outputs the calculated current value as a non-restrictive current command, and outputs a limited current command that is a current command using a predetermined current limit value (FL2I) as an upper limit. When the calculated current value is equal to or smaller than the current limit value (FL2I), the non-restrictive current command and the limited current command indicate the same current value. Meanwhile, when the calculated current value is larger than the current limit value (FL2I), the non-restrictive current command indicates the calculated current value and the limited current command indicates the current limit value (FL2I). The current limit value is determined based on thrust of the linear motor 10 and a force that presses the suction pad 11 against the workpiece P when the workpiece P is picked up.

The switch unit 204 selects any one of the limited current command and the non-restrictive current command, which are output from the speed control unit 203 based on the control of the position determination unit 211. The current control unit 205 calculates a voltage command based on the current command that is selected by the switch unit 204 and the value of a current that flows in the linear motor 10 and is measured by the current transformer 207. The electric power converter 206 supplies a voltage, which corresponds to the voltage command calculated by the current control unit 205, to the linear motor 10.

The current transformer 207 is mounted on an electric power line that connects the electric power converter 206 to the linear motor 10. Further, the current transformer 207 measures the value of a current that flows in the electric power line. Furthermore, the current transformer 207 outputs a signal, which indicates the measured value of the current, to the current control unit 205, the speed-change position-setting unit 210, and the completion signal generating unit 212.

The speed calculating unit 208 calculates the movement speed of the rod 101 of the linear motor 10 based on variations of the sine wave signal and the cosine wave signal (the outputs VoutA and VoutB) that are output from the magnetic sensor 112 mounted on the linear motor 10.

The position calculating unit 209 calculates a moving distance of the rod 101 from the origin based on variations of the sine wave signal and the cosine wave signal (the outputs VoutA and VoutB) that are output from the magnetic sensor 112. The position calculating unit 209 outputs position information, which indicates the position of the rod 101, to the position control unit 201, the speed-change position-setting unit 210, and the position determination unit 211.

The speed-change position-setting unit 210 outputs a signal, which indicates the FL mode start position that is a position where a speed command is changed to the second speed command from the first speed command, to the position determination unit 211 when the rod 101 and the suction pad 11 of the linear motor 10 are moved toward the workpiece P or the printed circuit board B. Further, the speed-change position-setting unit 210 outputs a speed change position (FL3POS), which is a position where a speed command is changed to the fourth speed command from the third speed command, to the position determination unit 211 when the rod 101 is being moved toward the origin after the workpiece P is sucked or after the workpiece P is mounted on the printed circuit board B.

Furthermore, when the workpiece P is picked up first, the speed-change position-setting unit 210 outputs an initial change position (FL2POSSUB), which has been stored in advance, to the position determination unit 211 as the FL mode start position. The speed-change position-setting unit 210 updates the FL mode start position based on the movement speed and the position of the rod 101 and a current flowing in the linear motor 10 when the workpiece P is picked up first, so as to reduce the time that is required for a step of picking up the workpiece P and a step of mounting the workpiece P on the printed circuit board B. After this, the speed-change position-setting unit 210 outputs the updated FL mode start position to the position determination unit 211. The initial change position is a position that is set in advance according to the height of the workpiece P, and is a position where the speed of the suction pad 11 (the rod 101 of the linear motor 10) starts to be reduced so that unnecessary impact is not applied to the workpiece P when the suction pad 11 comes into contact with the workpiece P. For example, the same position as the initial change position (FL2POSSUB) is set as the speed change position (FL3POS) in advance.

The position determination unit 211 performs control for making the switch unit 202 select any one of the four speed commands, which are output from the position control unit 201, based on a position command and an operation start signal that are input from the outside and the position information that is output from the position calculating unit 209. Further, the position determination unit 211 performs control for making the switch unit 204 select any one of two current commands, which are output from the speed control unit 203, based on the position command, the operation start signal, and the position information.

If the current value measured by the current transformer 207 reaches the predetermined current limit value (FL2I) when the suction pad 11 pressurizes the workpiece P, the completion signal generating unit 212 outputs an operation completion signal (UO2) to the outside.

Next, an operation, when the part mounting device 1 first picks up the workpiece P from the part feeder, will be described.

Figure 19:
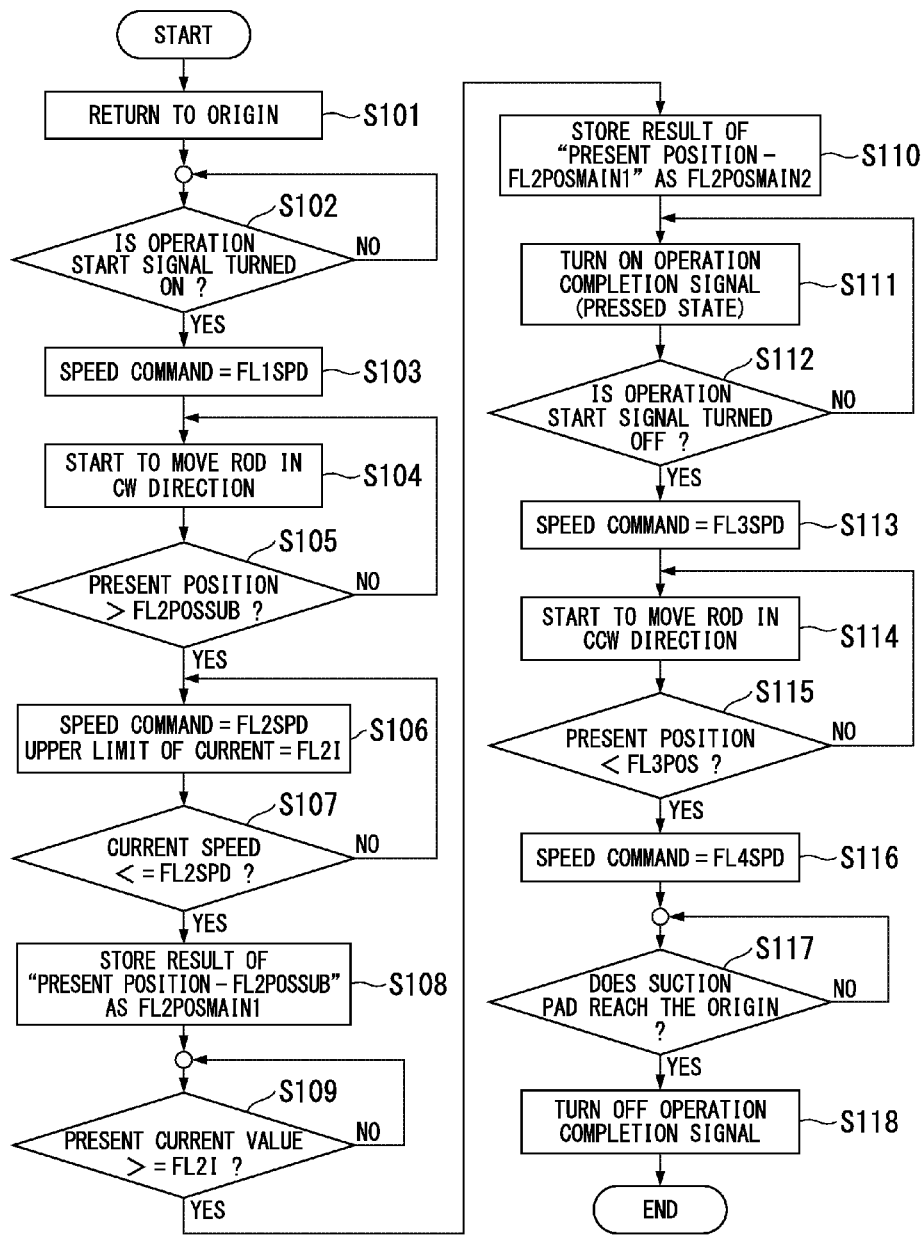
FIG. 19 is a flowchart showing an operation when the part mounting device 1 of the embodiment first picks up a workpiece P.

FIG. 19 is a flowchart showing an operation when the part mounting device 1 of the embodiment first picks up the workpiece P. Here, a direction in which the rod 101 approaches the workpiece P or the printed circuit board B is referred to as a CW direction, and a direction in which the rod 101 is away from the workpiece P or the printed circuit board B is referred to as a CCW direction.

When a position command based on the position of the workpiece P is input from the outside, the controller 20 starts to drive the linear motor 10 and performs an origin return for moving the suction pad 11 to the origin (Step S101). For example, the position of the suction pad 11 when the rod 101 is raised to the highest position is set in advance as the origin of the suction pad 11 of the embodiment.

When the origin return is completed, the position determination unit 211 determines whether or not an operation start signal (UI2) is turned on from the outside (Step S102) and waits until the operation start signal is turned on (NO in Step S101).

If the operation start signal is turned on in Step S102 (YES in Step S101), the position determination unit 211 makes the switch unit 202 select the first speed command (FL1SPD) and makes the switch unit 204 select the non-restrictive current command (Step S103) to move the rod 101 of the linear motor 10 toward the workpiece P (in the CW direction) (Step S104).

The position determination unit 211 determines whether or not the position of the suction pad 11 reaches the initial change position (FL2POSSUB) (Step S105), and drives the linear motor 10 by using the first speed command until the suction pad 11 reaches the initial change position (FL2POSSUB) (NO in Step S105).

If the suction pad 11 reaches the initial change position (FL2POSSUB) in Step S105 (YES in Step S105), the position determination unit 211 makes the switch unit 202 to select the second speed command and makes the switch unit 204 to select the limited current command (Step S106) to reduce the movement speed of the rod 101.

After the second speed command is selected, the speed-change position-setting unit 210 determines whether or not the movement speed of the rod 101 is equal to or lower than the speed indicated by the second speed command (FL2SPD) (Step S107) and repeats the determination until the movement speed of the rod 101 becomes equal to or lower than the second speed command (NO in Step S107).

If the movement speed of the rod 101 becomes equal to or lower than the second speed command in Step S107 (YES in Step S107), the speed-change position-setting unit 210 calculates a difference (FL2POSMAIN1) between the present position of the suction pad 11 and the initial change position (FL2POSSUB) and stores the calculated difference (FL2POSMAIN1) (Step S108).

The speed-change position-setting unit 210 determines whether or not the current value measured by the current transformer 207 is equal to or larger than the current limit value (FL2I) (Step S109), and waits until the current value reaches the current limit value (FL2I) (NO in Step S109).

If the speed-change position-setting unit 210 determines that the current value measured by the current transformer 207 reaches the current limit value (FL2I) and the measured current value is equal to or larger than the current limit value (FL2I) in Step S109 (YES in Step S109), the position obtained by subtracting the difference (FL2POSMAIN1), which is calculated in Step S108, from the present position of the suction pad 11, is stored as a new FL mode start position (FL2POSMAIN2) (Step S110). At this time, the completion signal generating unit 212 turns on the operation completion signal (UO2) and outputs the operation completion signal to the outside (Step S111).

When the new FL mode start position (FL2POSMAIN2) is calculated in Step S110, a predetermined distance Δd may be provided as a margin. Specifically, the position obtained by subtracting the difference (FL2POSMAIN1) and the distance Δd from the present position of the suction pad 11 may be used as a new FL mode start position (FL2POSMAIN2).

The position determination unit 211 determines whether or not an operation start signal input from the outside is turned off (Step S112), and waits until the operation start signal is turned off (NO in Step S112).

If the operation start signal is turned off in Step S112 (YES in Step S112), the position control unit 201 calculates a speed command according to a position command using the origin as a destination and the position determination unit 211 makes the switch unit 202 to select the third speed command and makes the switch unit 204 to select the limited current command (Step S113) to move the rod 101 toward the origin (in the CCW direction) (Step S114).

The position determination unit 211 determines whether or not the suction pad 11 reaches the speed change position (FL3POS) (Step S115), and waits until the suction pad 11 reaches the speed change position (FL3POS) (NO in Step S115).

If the suction pad 11 reaches the speed change position (FL3POS) in Step S115 (YES in Step S115), the position determination unit 211 makes the switch unit 202 to select the fourth speed command (Step S116).

Next, the position determination unit 211 determines whether or not the suction pad 11 reaches the origin (Step S117), and waits until the suction pad 11 reaches the origin (NO in Step S117).

If the suction pad 11 reaches the origin in Step S117, the position determination unit 211 outputs a signal, which shows that the suction pad 11 reaches the origin, to the completion signal generating unit 212 and the completion signal generating unit 212 turns off the operation completion signal (Step S118) to end an operation when the workpiece P is picked up first.

Figure 20:
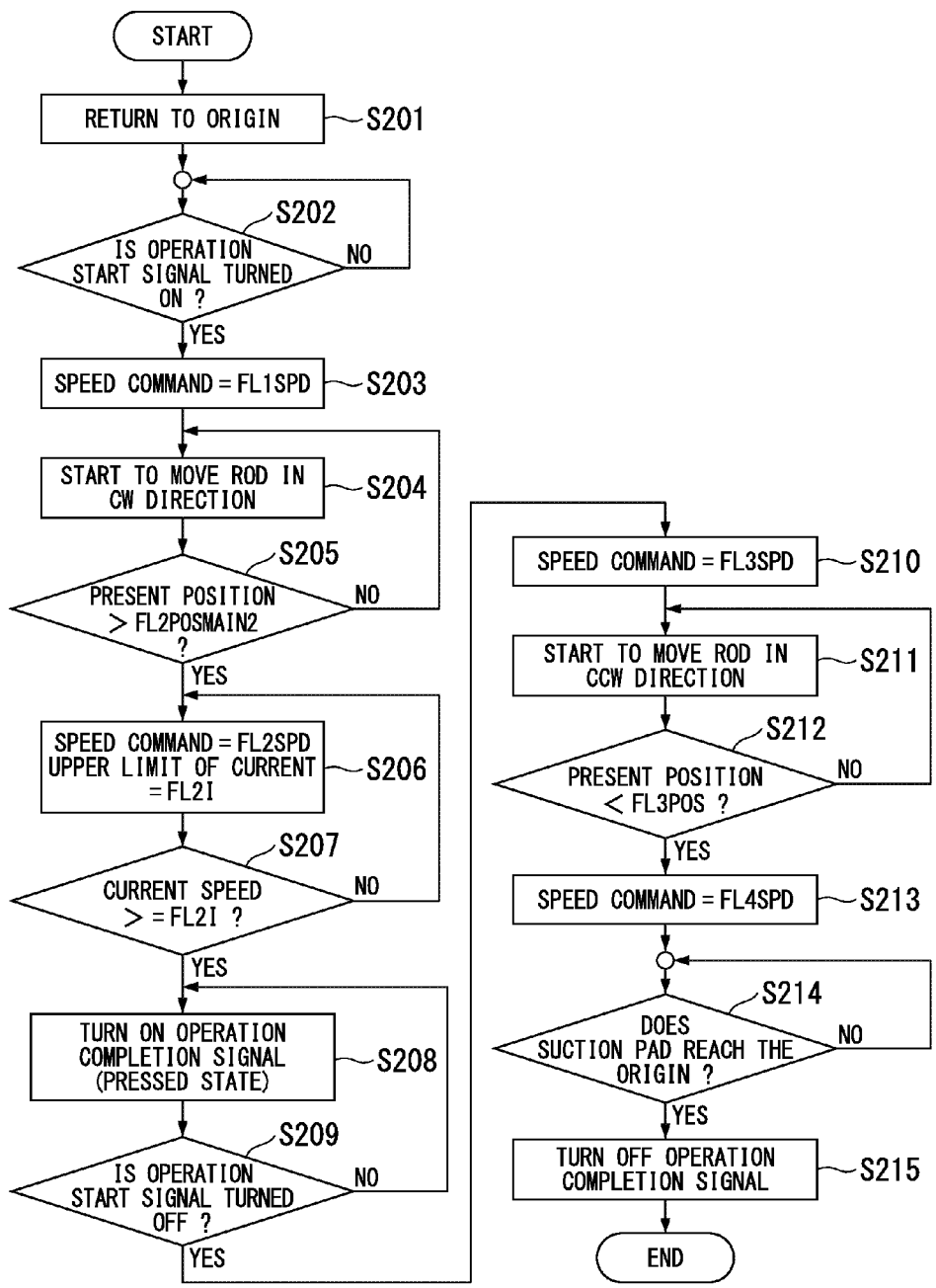
FIG. 20 is a flowchart showing an operation of the part mounting device 1 of the embodiment to mount the workpiece P on a printed circuit board B by using an updated FL mode start position, and an operation of the part mounting device 1 to pick up the workpiece P.

FIG. 20 is a flowchart showing an operation of the part mounting device 1 of the embodiment to mount the workpiece P on the printed circuit board B by using the updated FL mode start position, and an operation of the part mounting device 1 to pick up the workpiece P.

When a position command based on the position of the printed circuit board B on which the workpiece P is to be mounted or the position of the workpiece P is input from the outside, the controller 20 starts to drive the linear motor 10 and performs an origin return to move the suction pad 11 to the origin (Step S201).

When the origin return is completed, the position determination unit 211 determines whether or not the operation start signal (UI2) is turned on from the outside (Step S202) and waits until the operation start signal is turned on (NO in Step S202).

If the operation start signal is turned on in Step S202 (YES in Step S202), the position determination unit 211 makes the switch unit 202 to select the first speed command (FL1SPD) and makes the switch unit 204 to select the non-restrictive current command (Step S203) to move the rod 101 of the linear motor 10 toward the printed circuit board B or the workpiece P (in the CW direction) (Step S204).

The position determination unit 211 determines whether or not the position of the suction pad 11 reaches the FL mode start position (FL2POSMAIN2) (Step S205), and drives the linear motor 10 by using the first speed command until the suction pad 11 reaches the FL mode start position (FL2POSMAIN2) (NO in Step S205).

If the suction pad 11 reaches the FL mode start position (FL2POSMAIN2) in Step S205 (YES in Step S205), the position determination unit 211 makes the switch unit 202 to select the second speed command and makes the switch unit 204 to select the limited current command (Step S206) to reduce the movement speed of the rod 101.

The position determination unit 211 determines whether or not the current value measured by the current transformer 207 is equal to or larger than the current limit value (FL2I) (Step S207), and waits until the current value reaches the current limit value (FL2I) (NO in Step S207).

If the position determination unit 211 determines that the current value reaches the current limit value (FL2I) and the measured current value is equal to or larger than the current limit value (FL2I) in Step S207 (YES in Step S207), the position determination unit 211 outputs a signal, which shows that the current value reaches the current limit value (FL2I), to the completion signal generating unit 212. The completion signal generating unit 212 turns on the operation completion signal (UO2) and outputs the operation completion signal to the outside (Step S208).

The position determination unit 211 determines whether or not an operation start signal input from the outside is turned off (Step S209), and waits until the operation start signal is turned off (NO in Step S209).

If the operation start signal is turned off in Step S209 (YES in Step S209), the position control unit 201 calculates a speed command according to a position command using the origin as a destination and the position determination unit 211 makes the switch unit 202 to select the third speed command and makes the switch unit 204 to select the limited current command (Step S210) to move the rod 101 toward the origin (in the CCW direction) (Step S211).

The position determination unit 211 determines whether or not the suction pad 11 reaches the speed change position (FL3POS) (Step S212), and waits until the suction pad 11 reaches the speed change position (FL3POS) (NO in Step S212).

If the suction pad 11 reaches the speed change position (FL3POS) in Step S212 (YES in Step S212), the position determination unit 211 makes the switch unit 202 to select the fourth speed command (Step S213).

Next, the position determination unit 211 determines whether or not the suction pad 11 reaches the origin (Step S214), and waits until the suction pad 11 reaches the origin (NO in Step S214).

If the suction pad 11 reaches the origin in Step S214, the position determination unit 211 outputs a signal, which shows that the suction pad 11 reaches the origin, to the completion signal generating unit 212 and the completion signal generating unit 212 turns off the operation signal (Step S215) to end an operation to mount the workpiece P on the printed circuit board or an operation to pick up the workpiece P.

Figure 21:
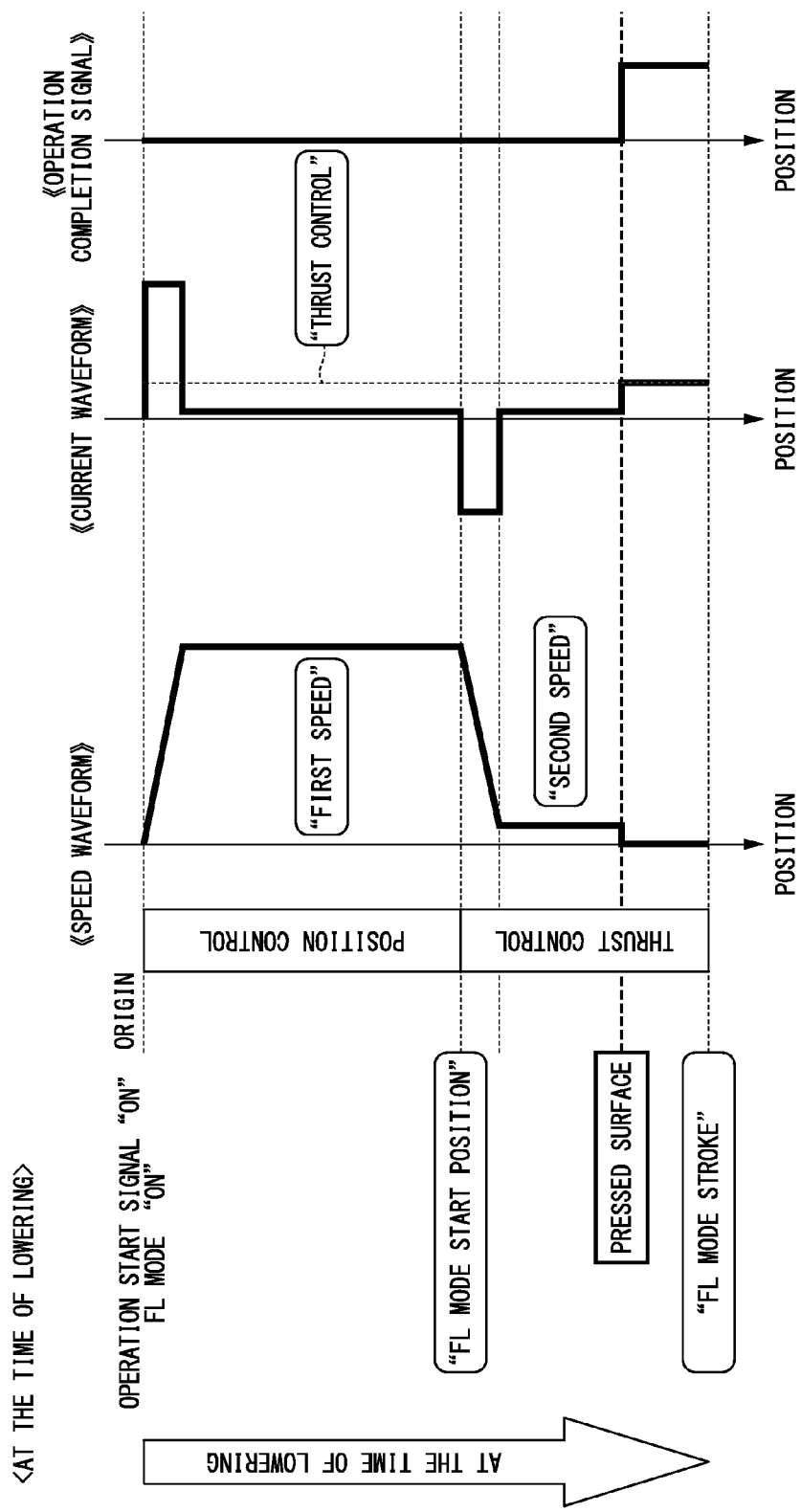
FIG. 21 is a waveform diagram showing the changes of the speed, the current, and an operation completion signal of an operation from Step S202 to Step S208 of FIG. 20.

FIG. 21 is a waveform diagram showing the changes of the speed, the current, and the operation completion signal of an operation from Step S202 to Step S208 of FIG. 20. In FIG. 21, the vertical axis represents the position of the suction pad 11.

When the operation start signal is turned on, the controller 20 moves the suction pad 11 toward the workpiece P at the first speed (FL1SPD). When the suction pad 11 reaches the FL mode start position (FL2POSMAIN2), the controller 20 reduces the speed of the suction pad 11 from the first speed (FL1 SPD) to the second speed (FL2SPD).

The controller 20 moves the suction pad 11 toward the workpiece P, which is placed on the part feeder, at the second speed (FL2SPD) and presses the suction pad 11 against the workpiece P. At this time, the controller 20 turns on the operation completion signal when a force for pressing the suction pad 11 against the workpiece P is larger than a force corresponding to the current limit value (FL2I).

A step of picking up the workpiece P from the part feeder (a step that continues until the workpiece P is sucked) has been described here, but a step of mounting the workpiece P, which has been picked up, on the printed circuit board B is also the same operation.

Figure 22:
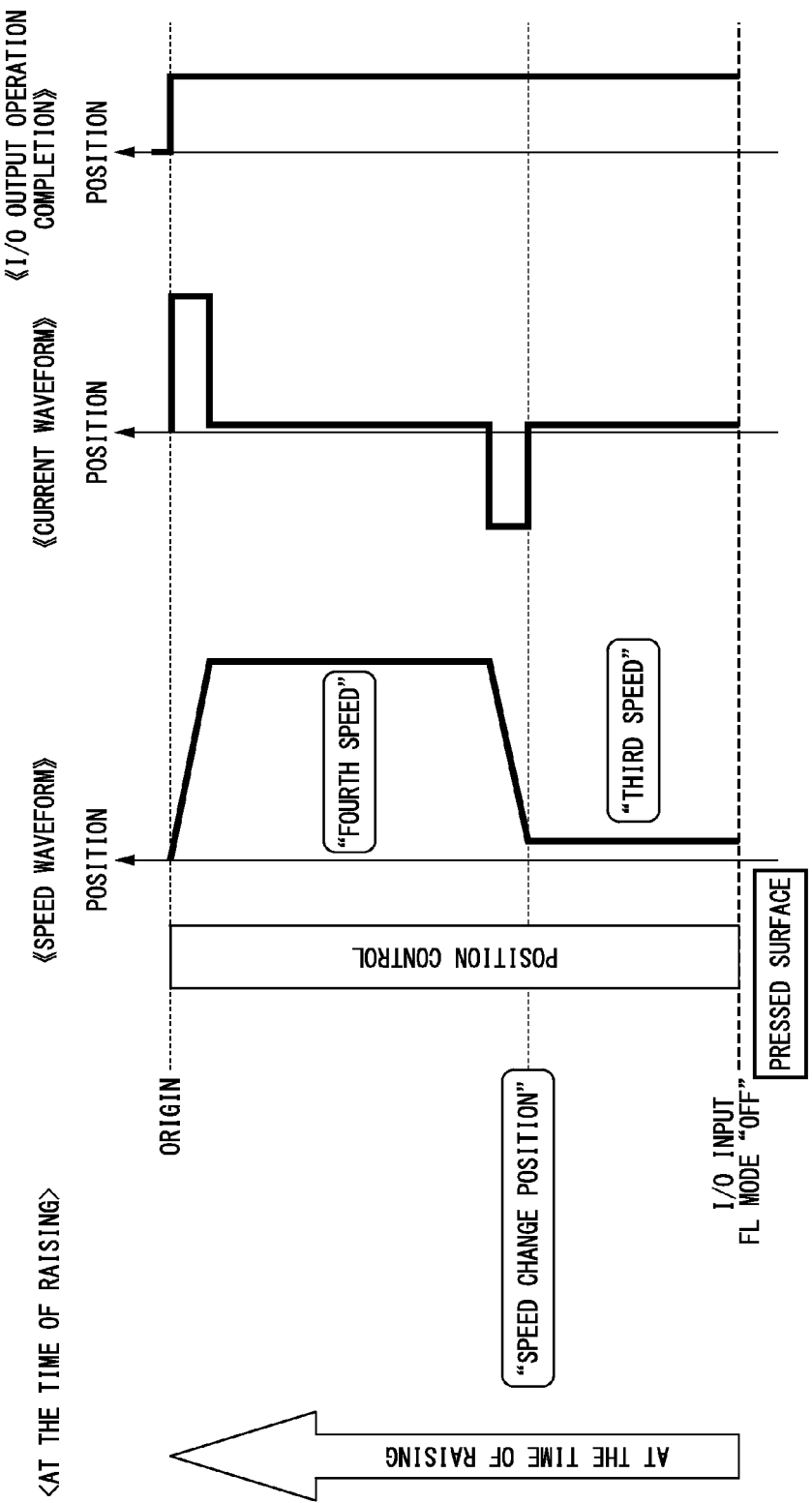
FIG. 22 is a waveform diagram showing the changes of the speed, the current, and an operation completion signal of an operation from Step S209 to Step S215 of FIG. 20.

FIG. 22 is a waveform diagram showing the changes of the speed, the current, and the operation completion signal of an operation from Step S209 to Step S215 of FIG. 20. In FIG. 22, the vertical axis represents the position of the suction pad 11.

After pressing the workpiece P against the suction pad 11, the controller 20 moves the suction pad 11, which has picked up the workpiece P (has sucked the workpiece P), toward the origin at the third speed (FL3SPD) and raises the suction pad 11. When the suction pad 11 reaches the speed change position, the controller 20 moves the suction pad 11 toward the origin at the fourth speed (FL4SPD) that is higher than the third speed (FL3SPD).

The controller 20 reduces the movement speed of the rod 101 of the linear motor 10 so that the speed of the suction pad 11 becomes 0 at the origin, and turns off the operation completion signal when the suction pad 11 reaches the origin.

A step of picking up the picked-up workpiece P has been described here, but a step after mounting the workpiece P on the printed circuit board B is also the same operation.

As described above, when first picking up the workpiece P when picking up the workpiece P, the part mounting device 1 detects a distance (difference (FL2POSMAIN1)) required for the reduction of speed and calculates a new FL mode start position (FL2POSMAIN2) from the position where the suction pad 11 comes into contact with the workpiece P and the difference (FL2POSMAIN1).

Further, the part mounting device 1 performs an operation to mount the picked-up workpiece P on the printed circuit board B and an operation to pick up the workpiece P using the FL mode start position (PS2POSMAIN2) that is calculated when the workpiece P is picked up first.

That is, the part mounting device 1 calculates an FL mode start position, which allows the shortest mounting time when the workpiece P is handled, based on the position of the workpiece P that is detected when the workpiece P is picked up first and a distance that is required for the reduction of speed from the first speed to the second speed, and mounts the workpiece P using the calculated FL mode start position.

Accordingly, the part mounting device 1 calculates the FL mode start position according to the height of the workpiece P to be handled, and can reduce the time required for a step of picking up the workpiece P and a step of mounting the workpiece P on the printed circuit board B using the calculated FL mode start position. Accordingly, the part mounting device 1 can reduce the time that is required for a step of mounting the workpiece P. In particular, when the movement of the linear motor 10 on a horizontal drive shaft and the drive of the linear motor 10 are sequentially performed, it is possible to improve production efficiency by reducing the time that is required for each step.

An example in which the part mounting device 1 mounts one kind of electronic part (workpiece P) on the printed circuit board B has been described in the above-mentioned embodiment. However, the invention is not limited thereto, and the part mounting device 1 may mount n kinds of electronic parts (workpieces P1, P2, Pn: n≥2) on the printed circuit board B. In this case, whenever the kinds of parts are changed, processing for updating an FL mode start position illustrated in FIG. 19 is performed. An upper apparatus may count the number of each of the workpieces P1, P2, Pn and notify the speed-change position-setting unit 210 of the change of the kinds of parts from the outside, whenever the kinds of parts are changed, to perform the processing of updating the FL mode start position. Further, the upper apparatus may detect a difference between the shapes of the respective workpieces P1, P2, Pn by proximity sensors or the like mounted on the part feeder and notify the speed-change position-setting unit 210 of the difference to perform the processing of updating the FL mode start position.

Accordingly, the part mounting device 1 can reduce the time (takt time) that is required for a step of mounting the plurality of workpieces P1, P2, Pn on the printed circuit board B, so that production efficiency can be improved.

Further, in the above-mentioned embodiment, whenever the workpiece P is picked up, the time after the speed of the suction pad 11 is reduced to the second speed and the suction pad 11 is pressed against the workpiece P, until the current value reaches the current limit value (FL2I) may be measured, and the FL mode start position (FL2POSMAIN2) may be changed so that the measured time (T) is in a predetermined set time range (t1≤t≤t2). That is, after the speed of the suction pad 11 is reduced to the second speed, the FL mode start position (FL2POSMAIN2) may be changed so that the time (T) until the suction pad 11 is pressed against the workpiece P with a predetermined force is in a predetermined set time range (t1≤t≤t2).

Specifically, when the measured time (T) is longer than time (t2) (T>t2), the speed-change position-setting unit 210 changes the FL mode start position (FL2POSMAIN2), which is calculated in Step S110, near the workpiece P by a short distance ΔP to reduce takt time. Further, when the time (T) is shorter than time (t1) (T<t1), the speed-change position-setting unit 210 changes the FL mode start position (FL2POSMAIN2), which is calculated in Step S110, near the origin by a short distance ΔP to avoid a collision between the suction pad 11 and the workpiece P. Here, the short distance ΔP is a distance that is set in advance according to a resolution of the position control of the linear motor 10. The set time range (t1≤t≤t2) is determined according to the characteristics of the linear motor 10 and the variation of the height of the workpiece P.

Accordingly, it is possible to improve production efficiency by further reducing takt time while preventing damage to the workpiece P or the printed circuit board B.

MODIFIED EXAMPLES

The structure in which the speed-change position-setting unit 210 stores the initial change position (FL2POSSUB) in advance has been described in the above-mentioned embodiment. However, the part mounting device 1 may operate as described below to acquire the initial change position (FL2POSSUB).

Figure 23:
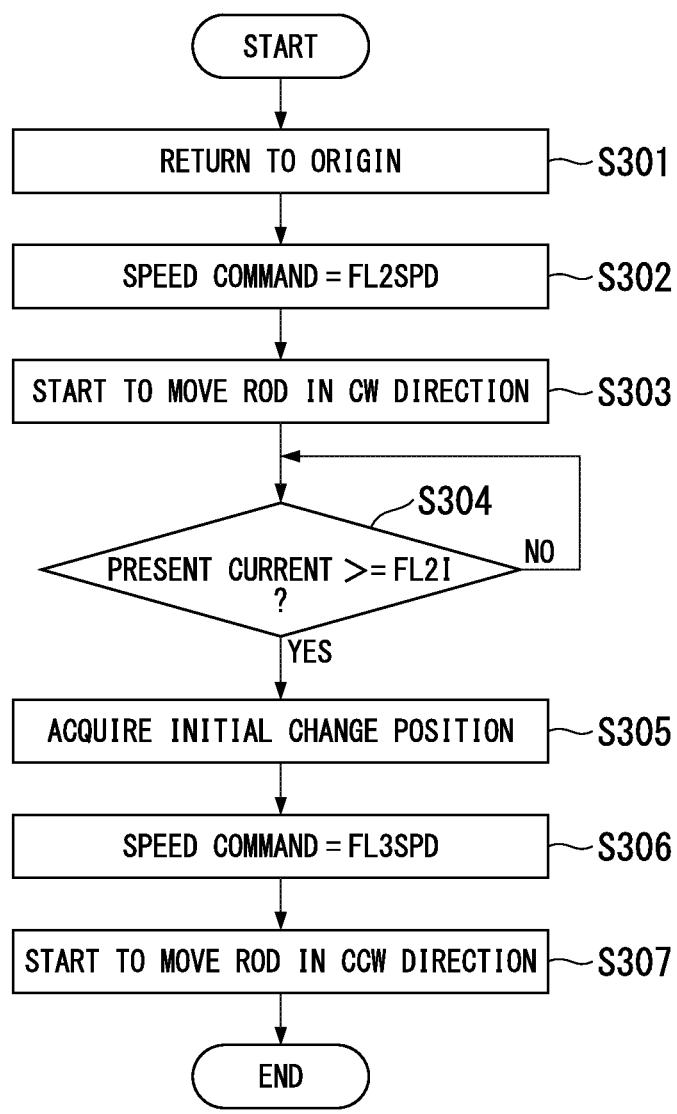
FIG. 23 is a flowchart showing an operation of the part mounting device 1 to acquire an initial change position.

FIG. 23 is a flowchart showing an operation of the part mounting device 1 to acquire an initial change position. When a command to acquire an initial change position is input to the controller 20 from the outside, the controller 20 performs an origin return for moving the suction pad 11 to the origin (Step S301).

The position determination unit 211 makes the switch unit 202 select the second speed command (FL2SPD) and makes the switch unit 204 select the limited current command (Step S302) to move the rod 101 of the linear motor 10 toward the printed circuit board B or the workpiece P (in the CW direction) (Step S303).

The position determination unit 211 determines whether or not the current value measured by the current transformer 207 is equal to or larger than the current limit value (FL2I) (Step S304), and waits until the current value reaches the current limit value (FL2I) (NO in Step S304).

If the position determination unit 211 determines that the current value reaches the current limit value (FL2I) and the measured current is equal to or larger than the current limit value (FL2I) in Step S304 (YES in Step S304), the speed-change position-setting unit 210 acquires the initial change position (FL2POSSUB) by calculating the initial change position (FL2POSSUB) based on the distance (FLPOS) between the present position of the suction pad 11 and the origin (Step S305).

For example, a position corresponding to "{the distance (FLPOS) to the origin}/2", that is, a half of a moving distance after the origin return, is referred to as the initial change position (FL2POSSUB). At this time, the speed-change position-setting unit 210 may set "{the distance (FLPOS) to the origin}/2" to the speed change position (FL3POS).

Further, the initial change position (FL2POSSUB) may be calculated based on the distance (FLPOS) to the origin and a distance that is required for the reduction of speed from the first speed to the second speed.

When the speed-change position-setting unit 210 acquires the initial change position (FL2POSSUB), the position determination unit 211 makes the switch unit 202 to select the third speed command (FL3 SPD) and makes the switch unit 204 to select the limited current command (Step S306) to move the rod 101 to the origin toward the origin (in the CCW direction) (Step S307). When the suction pad 11 reaches the origin, the position determination unit 211 stops the linear motor 10 to end processing.

Figure 24:
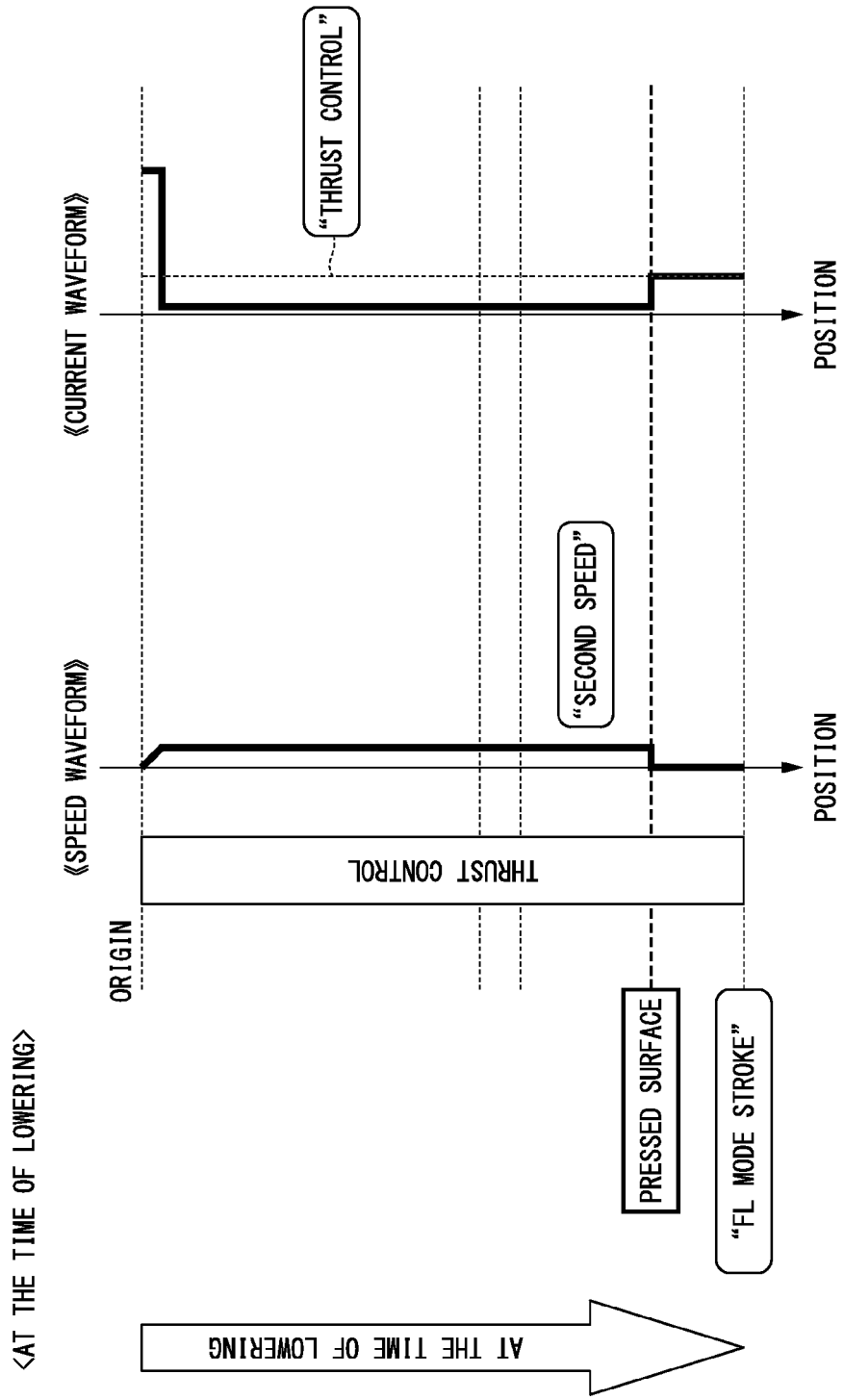
FIG. 24 is a waveform diagram showing the changes of the speed and the current of an operation from Step S302 to Step S304 of FIG. 23.
Figure 25:
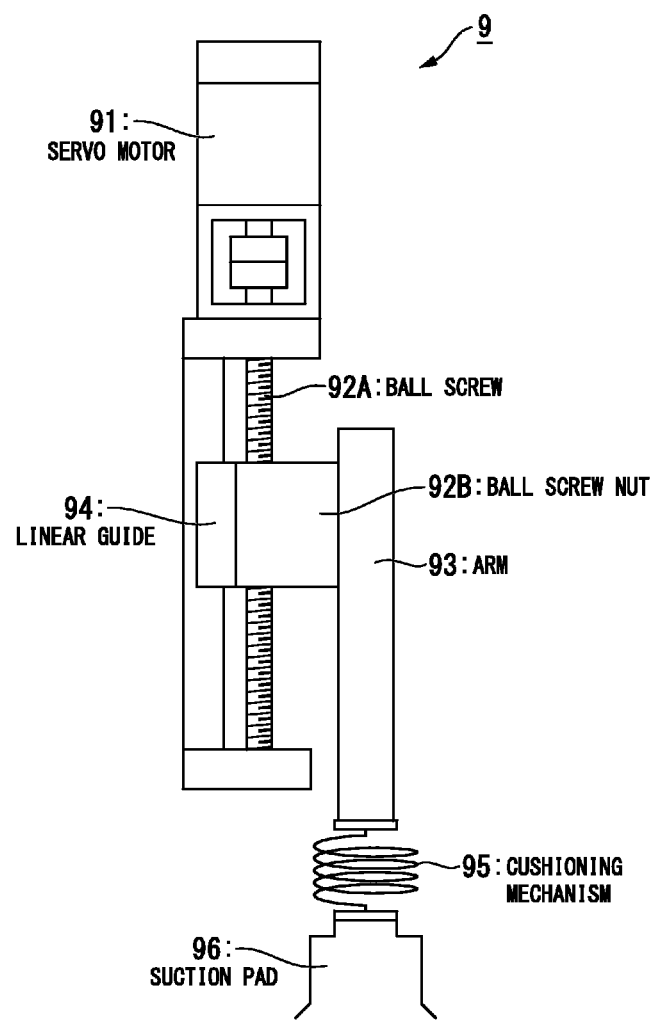
FIG. 25 is a view showing the structure of a part mounting device 9.

FIG. 24 is a waveform diagram showing the changes of the speed and the current of an operation from Step S302 to Step S304 of FIG. 23. In FIG. 24, the vertical axis represents the position of the suction pad 11.

When a command to acquire an initial change position is input, the controller 20 moves the suction pad 11 toward the workpiece P at the second speed (FL2SPD). The controller 20 detects the change of a current that flows in the linear motor 10 when the suction pad 11 is pressed against the workpiece P, and acquires the position (FLPOS) of a pressed surface of the workpiece P. The controller 20 acquires the initial change position (FL2POSSUB) based on the position (FLPOS) of the pressing surface.

Since the part mounting device 1 of the modified example acquires the initial change position (FL2POSSUB) as described above, a user can omit labor and time that are required to set the initial change position (FL2POSSUB). For example, since a user does not need to set the initial change position (FL2POSSUB) when the size of the workpiece P is frequently changed or the position of the board B is changed, it is possible to reduce the time that is required for a step of mounting the workpiece P on the board B.

In the above-mentioned embodiment, the speed change position (FL3POS) may be set to be the same as the FL mode start position (FL2POSMAIN2). Further, in the above-mentioned embodiment, it may be possible to move the rod 101 using the fourth speed command without using the third speed command when the rod 101 of the linear motor 10 is moved toward the origin (in the CCW direction).

Furthermore, in the above-mentioned embodiment, the suction pad 11 may not be mounted on the rod 101 of the linear motor 10 and the rod 101 may perform an operation to apply pressure to the workpiece P by moving up and down. That is, the part mounting device 1 may be used as a linear motor device that pressurizes the workpiece P.

A pressurizing target of the invention corresponds to the workpiece P of the embodiment. Further, a deceleration start position of the invention corresponds to the FL mode start position of the embodiment.

The above-mentioned controller 20 may include a computer system therein. In this case, processes of the processing that are performed by the above-mentioned position control unit 201, the above-mentioned switch unit 202, the above-mentioned speed control unit 203, the above-mentioned switch unit 204, the above-mentioned current control unit 205, the above-mentioned speed calculating unit 208, the above-mentioned position calculating unit 209, the above-mentioned speed-change position-setting unit 210, the above-mentioned position determination unit 211, and the above-mentioned completion signal generating unit 212 are stored in a computer-readable recording medium in the form of a program. A computer reads and executes this program, so that the processing of each functional unit is performed. Here, the computer-readable recording medium means a magnetic disc, a magnetic optical disc, a CD-ROM, a DVD-ROM, a semiconductor memory, and the like. Further, this computer program is delivered to a computer through a communication line, and the computer to which the computer program has been delivered may execute the program.

INDUSTRIAL APPLICABILITY

According to the invention, it is possible to reduce time that is required to pressurize an article using a motor.

REFERENCE SIGNS LIST

1: part mounting device
10: linear motor
11: suction pad
20: controller
210: speed-change position-setting unit

The invention claimed is:

1. A linear motor device comprising:
a linear motor; and
a controller that controls application of pressure to a pressurizing target by moving a needle provided in the linear motor,
wherein the controller includes:
a speed-change position-setting unit that calculates a deceleration start position, which is a position where a movement speed of the needle starts to be reduced from a first speed to a second speed, based on a distance required to reduce the movement speed of the needle from the first speed to the second speed which is lower than the first speed and at which pressure applied to the pressurizing target when the needle comes into contact with the pressurizing target is equal to or lower than a predetermined pressure and a position of the needle when a determination is made that a current value is equal to or larger than a predetermined current limit value; and
a position determination unit that drives the needle of the linear motor at the first speed when the needle is moved from the position of the needle when a determination is made that a current value is equal to or larger than the predetermined current limit value, and moves the needle at the second speed when the needle reaches the deceleration start position, and
wherein when a determination is made that the current value is equal to or larger than the predetermined current limit value, the controller outputs an operation completion signal and holds the current value and the pressure applied to the pressurizing target past the determination that the current value is equal to or larger than the predetermined current limit value, and after outputting the operation completion signal, when a determination is made that an operation start signal is inputted, the controller moves the needle opposite to a direction in which the pressure is applied to the pressurizing target.

2. The linear motor device according to claim 1,
wherein the speed-change position-setting unit changes the deceleration start position by a predetermined short distance so that time after the speed of the needle is reduced to the second speed until the pressurizing target is pressed with a predetermined force is in a predetermined set time range.

3. The linear motor device according to claim 1,
wherein when the pressurizing target is configured of a plurality of kinds of pressurizing targets, the speed-change position-setting unit calculates the deceleration start position whenever the kinds of the pressurizing targets are changed.

4. The linear motor device according to claim 1,
wherein the speed-change position-setting unit moves the needle from the predetermined position toward the pressurizing target at the second speed, detects the position of the needle when it is determined that the current value is equal to or larger than the predetermined current limit value, and calculates the deceleration start position based on the detected position of the needle.

5. The linear motor device according to claim 1, further comprising:
a suction pad that is mounted on the needle and sucks and holds the pressurizing target,
wherein the speed-change position-setting unit calculates the deceleration start position based on the distance required to reduce the speed of the needle from the first speed to the second speed which is lower than the first speed and at which pressure applied to the pressurizing target by the needle is equal to or lower than a predetermined pressure and the position of the needle when it is determined that the current value is equal to or larger than the current limit value.

6. A control method for a linear motor device including a linear motor and a controller that controls application of pressure to a pressurizing target by moving a needle provided in the linear motor, the control method comprising:
a speed-change position-setting step of calculating a deceleration start position, which is a position where a movement speed of the needle starts to be reduced from a first speed to a second speed, based on a distance required to reduce the movement speed of the needle from the first speed to the second speed which is lower than the first speed and at which pressure applied to the pressurizing target when the needle comes into contact with the pressurizing target is equal to or lower than a predetermined pressure and a position of the needle when a determination is made that a current value is equal to or larger than a predetermined current limit value;

a position determining step of driving the needle of the linear motor at the first speed when the needle is moved from the position of the needle when a determination is made that the current value is equal to or larger than the predetermined current limit value, and moving the needle at the second speed when the needle reaches the deceleration start position;

a waiting step of, when a determination is made that the current value is equal to or larger than the predetermined current limit value, outputting an operation completion signal and retaining the current value and the pressure applied to the pressurizing target past the determination that the current value is equal to or larger than the predetermined current limit value; and a moving-toward-origin step of, after outputting the operation completion signal and when a determination is made that an operation start signal is inputted, moving the needle opposite to a direction in which the pressure is applied to the pressurizing target.

7. The linear motor device according to claim 1, wherein the deceleration start position is a position that is away from the position of the needle when it is determined that the current value is equal to or larger than the predetermined current limit value, by at least the distance required to reduce the movement speed of the needle to the second speed.

* * * * *